United States Patent
Kim et al.

(10) Patent No.: US 7,359,264 B2
(45) Date of Patent: Apr. 15, 2008

(54) SEMICONDUCTOR MEMORY DEVICE

(75) Inventors: Du-Yeul Kim, Suwon-si (KR); Byung-Chul Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 45 days.

(21) Appl. No.: 11/500,262

(22) Filed: Aug. 7, 2006

(65) Prior Publication Data
US 2007/0030743 A1 Feb. 8, 2007

(30) Foreign Application Priority Data
Aug. 5, 2005 (KR) ...................... 10-2005-0071956

(51) Int. Cl.
*G11C 7/00* (2006.01)

(52) U.S. Cl. ............ 365/200; 365/230.01; 365/230.03; 365/230.06

(58) Field of Classification Search ................ 365/200, 365/230.03, 230.01, 230.06
See application file for complete search history.

(56) References Cited

U.S. PATENT DOCUMENTS

| | | | |
|---|---|---|---|
| 5,126,973 A * | 6/1992 | Gallia et al. | 365/200 |
| 2005/0270862 A1* | 12/2005 | Cowles et al. | 365/200 |

FOREIGN PATENT DOCUMENTS

| | | |
|---|---|---|
| JP | 10003798 | 1/1998 |
| JP | 2002025288 | 1/2002 |
| KR | 1995 0020754 | 7/1995 |
| KR | 20030002802 | 9/2003 |

OTHER PUBLICATIONS

English Abstract for Publication No. 1995-0020754.
English Abstract for Publication No. 10-003798.
English Abstract for Publication No. 2002-025288.
English Abstract for Publication No.: 1020030002802.

* cited by examiner

*Primary Examiner*—Thong Q. Le
(74) *Attorney, Agent, or Firm*—F. Chau & Associates, LLC.

(57) ABSTRACT

A semiconductor memory device includes a memory cell array a redundant enable signal generating circuit and redundant decoder. The memory cell array includes memory cell array blocks including column selecting signal lines and lower and upper blocks. The redundant enable signal generating circuit programming defective addresses, during a mode setting operation and generating a redundant enable signal when the defective addresses are applied during an operation. The redundant decoder including decoders selecting a corresponding redundant column selecting signal line in response to the redundant enable signal, a corresponding block address, and a lower and upper block address, wherein each of the of decoders is electrically connected to one of the lower and upper blocks.

8 Claims, 3 Drawing Sheets

US 7,359,264 B2

SEMICONDUCTOR MEMORY DEVICE

CROSS-REFERENCE TO RELATED APPLICATION

This application claims the benefit of Korean Patent Application No. 2005-71956, filed Aug. 5, 2005 in the Korean Intellectual Property Office, the disclosure of which is hereby incorporated herein by reference in its entirety.

BACKGROUND OF THE INVENTION

1. Field of the Invention

The present invention relates to a semiconductor memory device and, more particularly, to a semiconductor memory device in which a defective memory cell can be repaired after packaging.

2. Description of Related Art

Semiconductor memory devices include a memory cell array and a redundant memory cell array. When a defective memory cell is found in the memory cell array, the defective memory cell is replaced with a redundant memory cell in the redundant memory cell array, thereby repairing the defective semiconductor memory device.

Methods for replacing the defective memory cell with the redundant memory cell include replacing a word line connected to the defective memory cell with a redundant word line connected to the redundant memory cell and replacing a defective column selecting signal line connected to the defective memory cell with a redundant column selecting signal line connected to the redundant memory cell.

Of these, the method that replaces the column selecting signal line is used for replacing the defective memory cell with the redundant memory cell after packaging.

FIG. 1 is a schematic diagram illustrating a semiconductor memory device. The semiconductor memory device of FIG. 1 includes a memory cell array 10 having four (4) memory cell array blocks BK1 to BK4, a column decoder 12 having eight (8) decoders 12-1 to 12-8, a redundant column decoder 14 having four (4) decoders 14-1 to 14-4, a redundant enable signal generating circuit 16, and a block address decoder 18. The redundant enable signal generating circuit 16 includes redundant control signal generating circuits 16-11 and 16-12, a logical sum circuit 16-2, and a mode setting circuit 16-3. The four memory cell array blocks BK1 to BK4 include lower and upper blocks LBK1,UBK1 to LBK4,UBK4, respectively.

The memory cell array blocks BK1 to BK4 are selected in response to a 2-bit column address CA0/1 or CA0,CA1. Using the 2-bit column address CA0,CA1, the memory cell array block BK1 is selected when the column address CA0,CA1 is "00", the memory cell array block BK2 is selected when the column address CA0,CA1 is "01" the memory cell array block BK3 is selected when the column address CA0,CA1 is "10", and the memory cell array block BK4 is selected when the column address CA0,CA1 is "11". The decoders 12-1 to 12-8 are electrically connected to the upper or lower memory cell array blocks LBK1 to UBK4, respectively. The decoders 12-1 to 12-8 decode the column addresses CA2~9 or CA2 to CA9 to select a column selecting signal line. The decoders 12-1 to 12-8 are disabled when a redundant enable signal REN is activated and block selecting signals bk1 to bk4 are activated. For example, when the redundant enable signal REN is activated and the block selecting signal bk1 is activated, the decoders 12-1 are disabled. The decoders 14-1 to 14-4 are enabled to select redundant column selecting signal lines RCSL1 to RCSL4, respectively, when the redundant enable signal REN and the block selecting signals bk1 to bk4 are activated. The redundant column selecting signal lines RCSL1 to RCSL4 have line pairs RCSL11,RCSL12 to RCSL41,RCSL42 which are divided respectively for lower and upper blocks LBK1, UBK1 to LBK4,UBK4 of the memory cell array blocks BK1 to BK4. The mode setting circuit 16-3 receives a code CODE applied from an external portion to generate program column addresses PCA09 or PCA0 to PCA9 in response to a mode setting command MRS during a mode setting operation. The redundant control signal generating circuits 16-11 and 16-12 are programmed to defective column addresses in response to the program column addresses PCA0 to PCA9 during the mode setting operation. The redundant control signal generating circuits 16-11 and 16-12 generate redundant control signals REN1 and REN2 when the column addresses CA0 to CA9 including, CA0/1 and CA2 to CA9, applied from an external portion during a normal operation, e.g., a read operation, a write operation, etc., are identical to the programmed column addresses PCA0 to PCA9, respectively. The logical sum circuit 16-2 logically sums the redundant control signals REN1 and REN2 to generate the redundant enable signal REN. The block address decoder 18 decodes the column address CA0/1 to generate the block selecting signals bk1 to bk4.

The semiconductor memory device selects two lines of each of the line pairs RCSL11,RCSL12 to RCSL41,RCSL21 together when the decoders 41-1 to 14-4 select the redundant column selecting signals RCSL1 to RCSL4 and the redundant column selecting signals lines RCSL1 to RCSL4 are respectively selected.

In the semiconductor memory device of FIG. 1, when a defect occurs in a memory cell MC1 between the column selecting signal line CSL1 of the lower block LBK1 of the memory cell array block BK1 and a word line WL, the defective memory cell MC1 should be replaced with a redundant memory cell RMC1. If it is assumed that all column addresses CA0 to CA9 of the defective memory cell MC1 are "0" the mode setting circuit 16-3 receives the code CODE to generate the program column addresses PCA0 to PCA9 all of which are "0" in response to the mode setting command MRS. The redundant control signal generating circuit 16-11 is programmed to "0" in response to the program column addresses PCA0 to PCA9 during the mode setting operation and generates the redundant control signal REN1 when the column addresses CA0 to CA9 all of which are "0" are applied during the normal operation. The logical sum circuit 16-2 activates the redundant enable signal REN in response to the redundant control signal REN1. The block address decoder 18 decodes the column address CA0,CA1 of "00" to generate the block selecting signal bk1 of "1". The column address decoders 12-1 and 12-2 are disabled, whereas the redundant column address decoder 14-1 is enabled. The column address decoders 12-3 to 12-8 are enabled, and the redundant column address decoders 14-2 to 14-4 are disabled. As a result, the defective column selecting signal line CSL1 of the lower and upper blocks LBK1 and UBK1 of the memory cell array block BK1 is replaced with the redundant column selecting signal line RCSL11, whereby the defective memory cell MC1 is replaced with the redundant memory cell RMC1. At this time, a memory cell MC2 which is not defective is also replaced with a redundant memory cell array RMC2. Accordingly, the defective semiconductor memory device is repaired.

When a defect additionally occurs in a memory cell MC2 of the upper block UBK1 of the memory cell array block BK1, it is difficult to repair the defect. That is, since the redundant column selecting signal line RCSL12 is already used to replace the column selecting signal line CSL1 of the upper block UBK1 of the memory cell array block BK1, there is no redundant column selecting signal line for replacing the column selecting signal line CSL2 connected to the defective memory cell MC3.

To provide support for repairing MC2, an additional redundant column selecting signal line may be arranged per each memory cell array block. In this case, the layout area size of the memory cell array and device manufacturing costs are increased.

SUMMARY OF THE INVENTION

According to an embodiment of the present invention, a semiconductor memory device includes a memory cell array including a plurality of memory cell array blocks including a plurality of column selecting signal lines and lower and upper blocks, each of the plurality of memory cell array blocks accessible in response to a block address and including the plurality of column selecting signal lines selected in response to a column address, each of the lower and upper blocks including a redundant column selecting signal line selected in response to a redundant column selecting signal and accessible in response to a lower and upper block address. The semiconductor memory device includes a redundant enable signal generating circuit programming a defective block address, a defective lower and upper block address and a defective column address during a mode setting operation and generating a redundant enable signal when the defective block address, the defective lower and upper block address and the defective column address are applied during a normal operation. The semiconductor memory device includes a redundant decoder including a plurality of decoders for selecting a corresponding redundant column selecting signal line in response to the redundant enable signal, the corresponding block address, and the lower and upper block address, wherein each of the plurality of decoders is electrically connected to one of the lower and upper blocks of the plurality of memory cell array blocks.

The semiconductor memory device further comprises a normal decoder including a plurality of decoders for decoding the column address to select one of the plurality of column selecting signal lines, wherein each of the plurality of decoders is electrically connected to one of the lower and upper blocks of the plurality of memory cell array blocks and is disabled in response to the redundant enable signal, the corresponding block address and the lower and upper block address.

The semiconductor memory device further comprises a block address for decoding the block address and generating a block selecting signal.

The redundant enable signal generating circuit includes a mode setting circuit for receiving a code applied from an external portion to generate the defective block address, the defective lower and upper block address and the defective column address during the mode setting operation. The redundant enable signal generating circuit includes at least two redundant control signal generating circuits, each redundant control signal generating circuit including a fuse programmed in response to the defective block address, the defective lower and upper block address and the defective column address and respectively generating a redundant control signal when the block address, the lower and upper block address and the column address which are applied from an external portion are identical to the defective block address, the defective lower and upper block address and the defective column address which are programmed during the normal operation, and a logical sum circuit for logically summing the redundant control signals generated from the at least two redundant control signal generating circuits to generate the redundant enable control signal.

According to an embodiment of the present invention a semiconductor memory device includes a memory cell array including a plurality of memory cell array banks accessible in response to a bank address, each of the plurality of memory cell array banks including a plurality of memory cell array blocks, each of the plurality of memory cell array blocks accessible in response to a block address and including a plurality of column selecting signal lines selected in response to a column address and lower and upper blocks, each of lower and upper blocks including a redundant column selecting signal line selected in response to a redundant column selecting signal and accessible in response to a lower and upper block address. The semiconductor memory device includes a redundant enable signal generating circuit programming a defective bank address, a defective block address, a defective lower and upper block address, and a defective column address during a mode setting operation and generating a redundant enable signal when the defective bank address, the defective block address, the defective lower and upper block address, and the defective column address are applied during an operation. The semiconductor memory device includes a redundant decoder including a plurality of decoders for selecting a corresponding redundant column selecting signal line in response to the redundant enable signal, the corresponding bank address, the corresponding block address, and the lower and upper block address, wherein each of the plurality of decoders is electrically connected to one of the lower and upper blocks of the plurality of memory cell array blocks.

BRIEF DESCRIPTION OF THE DRAWINGS

The present invention will become more apparent to those of ordinary skill in the art by describing in detail preferred embodiments thereof with reference to the attached drawings in which.

DETAILED DESCRIPTION OF PREFERRED EMBODIMENTS

Figure 2:
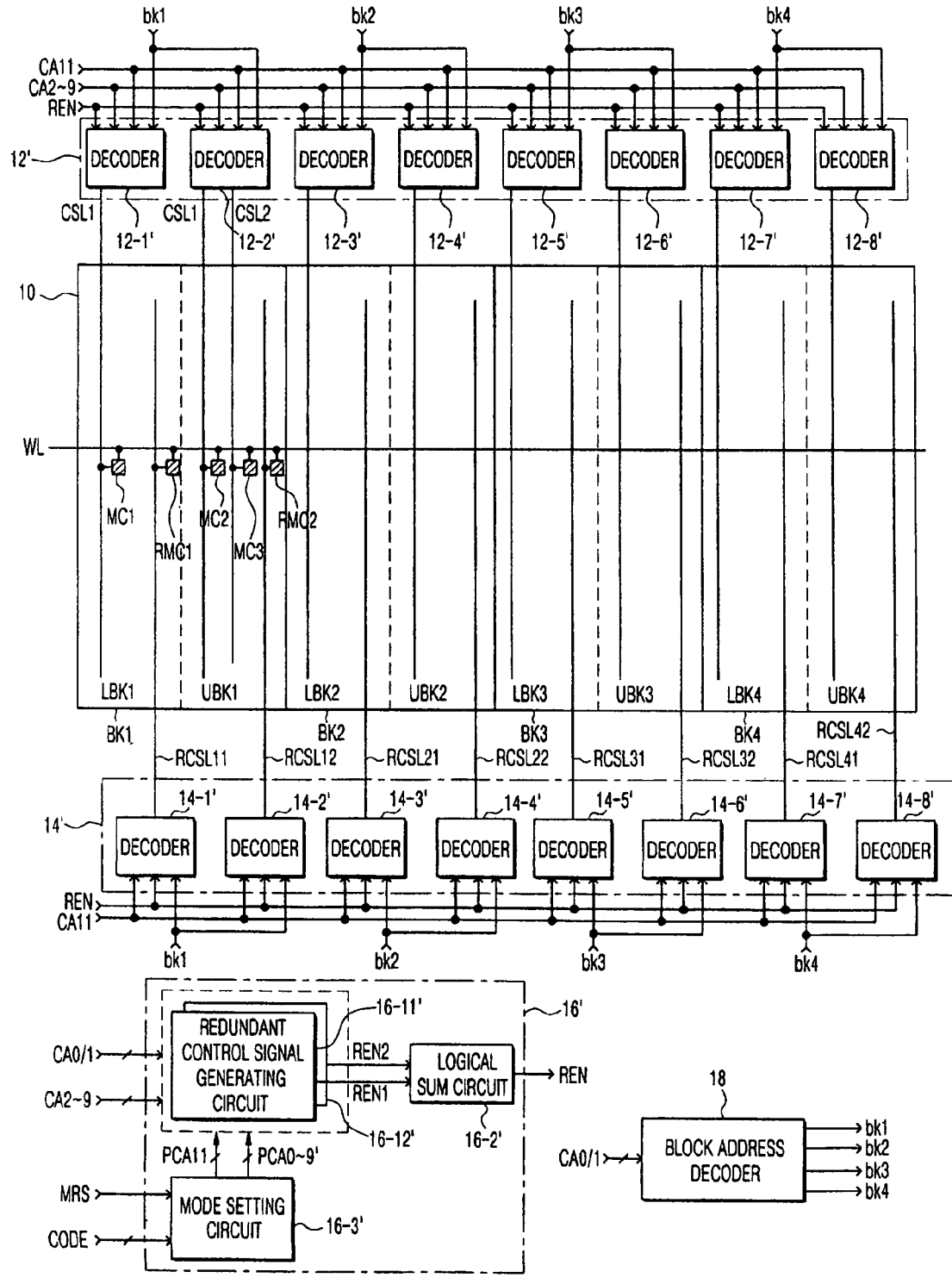
FIG. 2 is a schematic diagram illustrating a semiconductor memory device according to an embodiment of the present invention.

FIG. 2 is a schematic diagram illustrating a semiconductor memory device according to an embodiment of the present invention. The semiconductor memory device of FIG. 2 includes a memory cell array 10 having four (4) memory cell array blocks BK1 to BK4, a column decoder 12' having eight (8) decoders 12-1' to 12-8, a redundant column decoder 14' having eight (8) decoders 14-1' to 14-8' a redundant enable signal generating circuit 16', and a block address decoder 18. The redundant enable signal generating circuit 16' includes redundant control signal generating circuits 16-11' and 16-12' a logical sum circuit 16-2" and a mode setting circuit 16-3'. The four memory cell array blocks BK1 to BK4 include lower and upper blocks LBK1, UBK1 to LBK4,UBK4, respectively.

Figure 1:
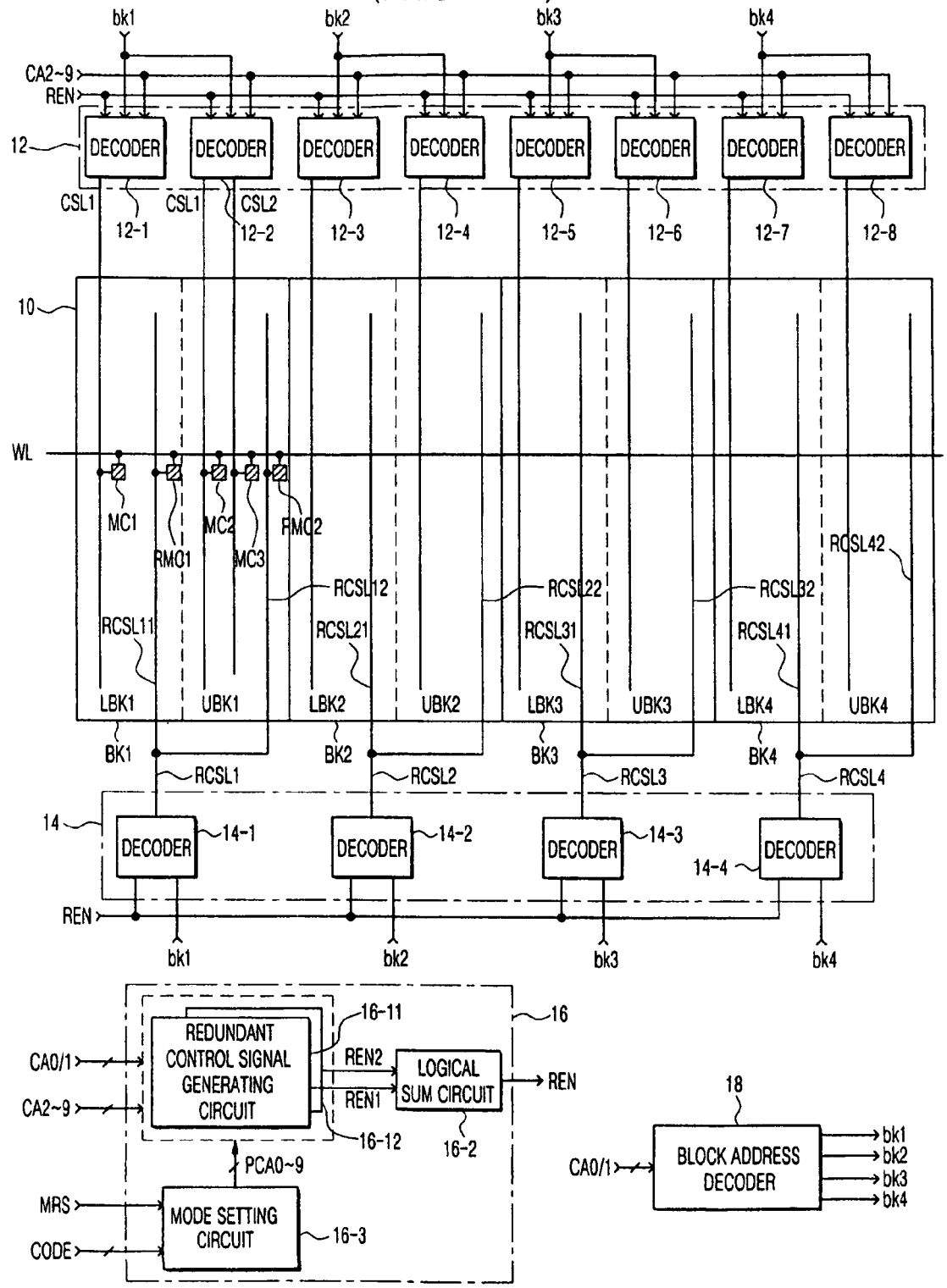
FIG. 1 is a schematic diagram illustrating a semiconductor memory device.

The memory cell array blocks BK1 to BK4 are selected in response to a 2-bit column address CA0/1 or CA0,CA1. The memory cell array block BK1 is selected when the column address CA0,CA1 is "00", the memory cell array block BK2 is selected when the column address CA0,CA1 is "01" the memory cell array block BK3 is selected when the column address CA0,CA1 is "10" and the memory cell array block BK4 is selected when the column address CA0,CA1 is "11". The lower blocks LBK1 to LBK4 are selected when a lower and upper block address CA11 is "0", and the upper blocks UBK1 to UBK4 are selected when the lower and upper block address CA11 is "1". The block LBK1 is selected when the address CA0,CA1,CA11 is "000", and the block UBK3 is selected when the address CA0,CA1,CA11 is "101". The decoders 12-1' to 12-8' are electrically connected to the blocks LBK1 to UBK4, respectively. The decoders 12-1' to 12-8' decode the column addresses CA2 to CA9 to select a column selecting signal line CSL. The odd-number decoders 12-1; 12-3; 12-5; and 12-7' are disabled when the redundant enable signal REN and a corresponding one of the block selecting signals bk1 to bk4 are activated and the lower and upper block address CA11 is deactivated. The even-number decoders 12-2', 12-4', 12-6' and 12-8' are disabled when the redundant enable signal REN and a corresponding one of the block selecting signals bk1 to bk4 are activated and the lower and upper block address CA11 is activated. For example, in a state that the redundant enable signal REN and the block selecting signal bk1 are activated, the decoder 12-1' is disabled when the lower and upper block address CA11 is deactivated, and the decoder 12-2' is disabled when the lower and upper block address CA11 is activated. The odd-number decoders 14-1', 14-3', 14-5; and 14-7' are enabled to respectively select the redundant column selecting signal lines RCSL11 to RCSL41 when the redundant enable signal REN and a corresponding one of the block selecting signals bk1 to bk4 are activated and the lower and upper block address CA11 is deactivated. The even-number decoders 14-2; 14-4; 14-6; and 14-8' are enabled to respectively select the redundant column selecting signal lines RCSL12 to RCSL42 when the redundant enable signal REN and a corresponding one of the block selecting signals bk1 to bk4 are activated and the lower and upper block address CA11 is activated. The redundant column selecting signal lines RCSL11 to RCSL42 are electrically connected to the lower and upper blocks LBK1, UBK1 to LBK4,UBK4, respectively, of the memory cell array blocks BK1 to BK4. The mode setting circuit 16-3' receives a code CODE applied from an external portion to generate program column addresses PCA0 to PCA9, and PCA11 in response to a mode setting command MRS during a mode setting operation. The redundant control signal generating circuits 16-11' and 16-12' are programmed to defective column addresses CA0 to CA9, including CA0/1 and CA2 to CA9, and CA11 in response to the program column addresses PCA0 to PCA9 and PCA11 during the mode setting operation and generate redundant control signals REN1 and REN2 when the column addresses CA0 to CA9 and CA11 applied from an external portion during a normal operation are identical to the programmed column addresses PCA0 to PCA9 and PCA11, respectively. The logical sum circuit 16-2' and the block address decoder 18 perform the same functions as those of FIG. 1.

In a semiconductor memory device according to an embodiment of the present invention, the redundant column selecting signal lines RCSL11 to RCSL42 are electrically connected to the lower and upper blocks LBK1,UBK1 to LBK4,UBK4, respectively. The decoders 14-1' to 14-8' respectively select the redundant column selecting signal lines RCSL11 to RCSL42. The lower and upper block address CA11 is applied to each of the decoders 12-1' to 12-8', each of the decoders 14-1' to 14-8', and the redundant enable signal generating circuit 16'.

In the semiconductor memory device of FIG. 2, when defects occur in a memory cell MC1 between the column selecting signal line CSL1 of the lower block LBK1 of the memory cell array block BK1 and a word line WL and a memory cell MC3 between the column selecting signal line CSL2 of the upper block UBK1 of the memory cell array block BK1 and the word line WL, the defective memory cells MC1 and MC3 are replaced with redundant memory cells RMC1 and RMC3. If it is assumed that all column addresses CA0 to CA9 and CA11 of the defective memory cell MC1 are "0" and the column addresses CA0 to CA9 and CA11 of the defective memory cell MC3 are "0 . . . 011", the mode setting circuit 16-3' receives the code CODE to generate the program column addresses PCA0 to PCA9 and PCA11 all of which are "0" corresponding to the defective memory cell MC1 and the program column addresses PCA0 to PCA9 and PCA11 which are "0 . . . 011" corresponding to the defective memory cell MC3 in response to the mode setting command MRS. During the mode setting operation, the redundant control signal generating circuit 16-11' is programmed to "0 . . . 000" in response to the program column addresses PCA0 to PCA9 and PCA11 all of which are "0", and the redundant control signal generating circuit 16-12' is programmed to "0 . . . 011" in response to the program column addresses PCA0 to PCA9 and PCA11 of which are "0 . . . 011".

When the addresses CA0 to CA9 to CA11 all of which are "0" are applied during the normal operation, the redundant control signal generating circuit 16-11' activates the redundant control signal REN1, and the logical sum circuit 16-2' activates the redundant enable signal REN in response to the redundant control signal REN1. The block address decoder 18 decodes the column address CA0,CA1 of "00" to generate the block selecting signal bk1 of "1", so that the column address decoder 12-1' is disabled and the redundant column address decoder 14-1' is enabled. The column address decoders 12-2' to 12-8' are enabled, and the redundant column address decoders 14-2' to 14-8' are disabled. As a result, the defective column selecting signal line CSL1 of the lower block LBK1 of the memory cell array block BK1 is replaced with the redundant column selecting signal line RCSL11, whereby the defective memory cell MC1 is replaced with the redundant memory cell RMC1.

When the addresses CA0 to CA9 to CA11 which are "0 . . . 011" are applied during the normal operation, the redundant control signal generating circuit 16-12' activates the redundant control signal REN2, and the logical sum circuit 16-2' activates the redundant enable signal REN in response to the redundant control signal REN2. The block address decoder 18 decodes the column address CA0,CA1 of "00" to generate the block selecting signal bk1 of "1", so that the column address decoder 12-2' is disabled and the redundant column address decoder 14-2' is enabled. The column address decoders 12-1' and 12-3' to 12-8' are enabled, and the redundant column address decoders 14-1' and 14-3' to 14-8' are disabled. As a result, the defective column selecting signal line CSL2 of the upper block UBK1 of the memory cell array block BK1 is replaced with the redundant column selecting signal line RCSL12, whereby the defective memory cell MC3 is replaced with the redundant memory cell RMC2.

Figure 3:
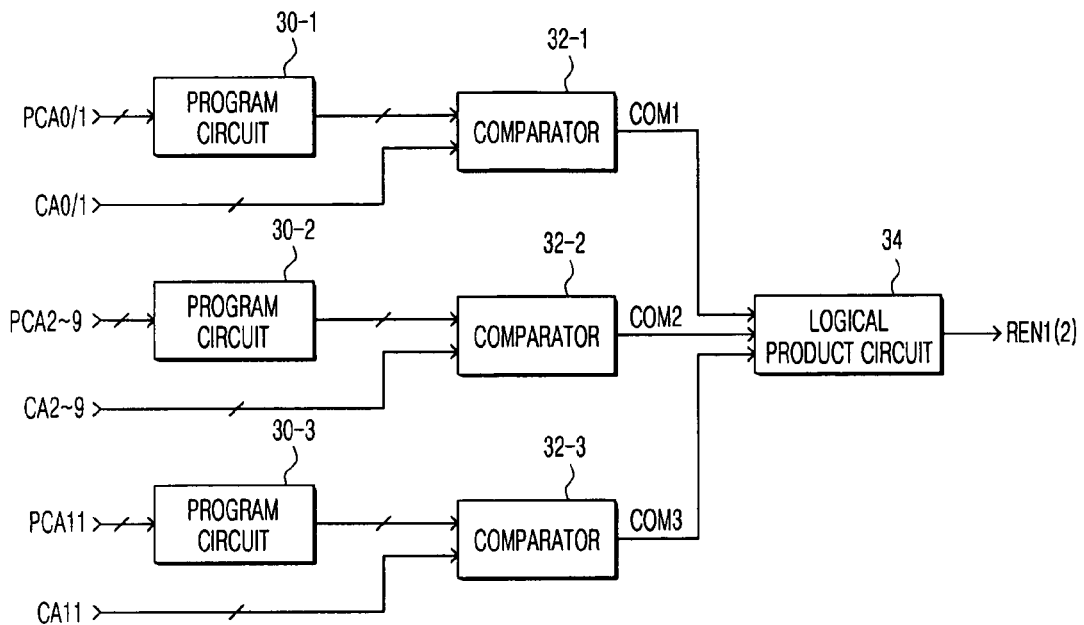
FIG. 3 is a block diagram illustrating a redundant control signal generating circuit according to an embodiment of the present invention.

A semiconductor memory device according to an embodiment of the present invention can repair the defective memory cells which are connected to the same column selecting signal line of the upper and lower blocks of one memory cell array block. FIG. 3 is a block diagram illustrating the redundant control signal generating circuit according to an embodiment of the present invention. The redundant control signal generating circuit of FIG. 3 includes program circuits 30-1 to 30-3, comparators 32-1 to 32-3 and a logical product circuit 34.

The program circuits 30-1 to 30-3 are programmed to a column address corresponding to the defective column selecting signal line, respectively, in response to the program addresses PCA0 and PCA1, PCA2 to PCA9, and PCA11. The comparators 32-1 to 32-3 generate comparison matching signals COM1, COM2, and COM3, respectively, when the defective addresses PCA0 and PCA1, PCA2 to PCA9, and PCA11 programmed to the program circuits 30-1 to 30-3 are identical to the column addresses CA0 and CA1, the column addresses CA2 to CA9, and the lower and upper block address CA11, respectively, which are applied from an external portion. The logical product circuit 34 logical-products the comparison matching signals COM1 to COM3 to generate the redundant enable signal REN1(2).

The redundant control signal generating circuit of FIG. 3 generates the redundant enable signal REN1(2) when the defective address PCA0 to PCA9 and PCA11 programmed during the mode setting operation are respectively identical to the addresses CA0 to CA9 and CA11.

Figure 4:
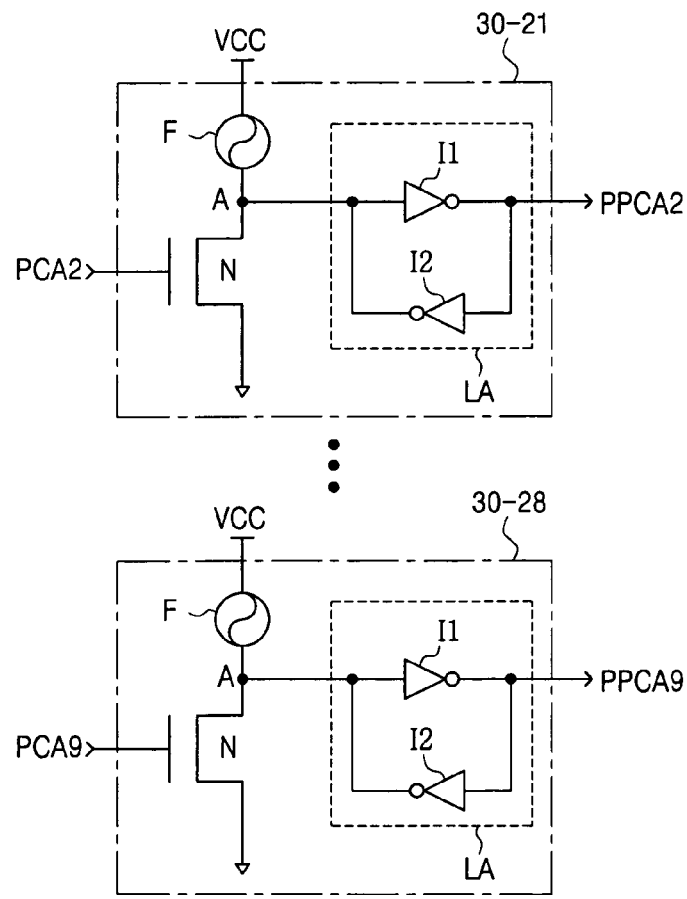
FIG. 4 is a circuit diagram illustrating a program circuit shown in FIG. 3.

FIG. 4 is a circuit diagram illustrating the program circuit shown in FIG. 3. The program circuit of FIG. 4 includes fuse circuits 30-21 to 30-38. Each of the fuse circuits 30-21 to 30-28 includes a fuse F, an NMOS transistor N, and a latch LA having inverters 11 and 12.

When the program column address having a low level is applied, the NMOS transistor N is turned off, so that the fuse F1 is not blown off. As a result, a node A becomes a high level, and the latch LA inverts and latches a signal of the node A having a high level to thereby generate a signal PPCA1 having a low level.

When the program column address having a high level is applied, the NMOS transistor N is turned on, and a prescribed amount of electric current flows through the fuse F1, and thus the fuse F1 is blown off and the node A becomes a low level. The latch LA inverts and latches a signal of the node A having a low level to thereby generate a signal PPCA1 having a high level.

Embodiments of the present invention have been described with respect to a memory cell array having a signal bank, but embodiments of the present invention can be applied to a plurality of memory cell array banks. In a case where the semiconductor memory device has four memory cell array banks, the redundant enable signal generating circuit 16' of FIG. 2 is configured to additionally program a bank address, and a bank address is additionally applied from an external portion. Further, it is configured such that a bank address decoder is additionally arranged to generate four bank selecting signals which are respectively applied to decoders corresponding to the corresponding memory cell array banks.

According to an embodiment of the present invention, a semiconductor memory device includes independent redundant column selecting signal lines for the lower and upper blocks of the memory cell array blocks and the decoder for respectively controlling the redundant column selecting signal lines, and repairing the defective memory cells.

What is claimed is:

1. A semiconductor memory device, comprising:
    a memory cell array including a plurality of memory cell array blocks including a plurality of column selecting signal lines and lower and upper blocks, each of the plurality of memory cell array blocks accessible in response to a block address, the plurality of column selecting signal lines selected in response to a column address, and each of the lower and upper blocks including a redundant column selecting signal line selected in response to a redundant column selecting signal and accessible in response to a lower and upper block address;
    a redundant enable signal generating circuit programming a defective block address, a defective lower and upper block address and a defective column address during a mode setting operation and generating a redundant enable signal when the defective block address, the defective lower and upper block address and the defective column address are applied during an operation; and
    a redundant decoder including a plurality of decoders for selecting a corresponding redundant column selecting signal line in response to the redundant enable signal, the corresponding block address, and the lower and upper block address, wherein each of the plurality of decoders is electrically connected to one of the lower and upper blocks of the plurality of memory cell array blocks.

2. The device of claim 1, further comprising, a decoder including a plurality of decoders for decoding the column address to select one of the plurality of column selecting signal lines, wherein each of the plurality of decoders is electrically connected to one of the lower and upper blocks of the plurality of memory cell array blocks and is disabled in response to the redundant enable signal, the corresponding block address and the lower and upper block address.

3. The device of claim 2, further comprising, a block address decoder for decoding the block address and generating a block selecting signal.

4. The device of claim 3, wherein the redundant enable signal generating circuit comprises:
    a mode setting circuit for receiving a code applied from an external portion to generate the defective block address, the defective lower and upper block address and the defective column address during the mode setting operation;
    at least two redundant control signal generating circuits, each redundant control signal generating circuit including a fuse programmed in response to the defective block address, the defective lower and upper block address and the defective column address and respectively generating a redundant control signal when the block address, the lower and upper block address and the column address which are applied from the external portion are identical to the defective block address, the defective lower and upper block address and the defective column address which are programmed during the operation; and
    a logical sum circuit for logically summing the redundant control signals generated from the at least two redundant control signal generating circuits to generate the redundant enable control signal.

5. A semiconductor memory device, comprising:

a memory cell array including a plurality of memory cell array banks accessible in response to a bank address, each of the plurality of memory cell array banks including a plurality of memory cell array blocks, each of the plurality of memory cell array blocks accessible in response to a block address and including a plurality of column selecting signal lines selected in response to a column address and lower and upper blocks, each of lower and upper blocks including a redundant column selecting signal line selected in response to a redundant column selecting signal and accessible in response to a lower and upper block address;

a redundant enable signal generating circuit programming a defective bank address, a defective block address, a defective lower and upper block address, and a defective column address during a mode setting operation and generating a redundant enable signal when the defective bank address, the defective block address, the defective lower and upper block address, and the defective column address are applied during an operation; and a redundant decoder including a plurality of decoders for selecting a corresponding redundant column selecting signal line in response to the redundant enable signal, the corresponding bank address, the corresponding block address, and the lower and upper block address, wherein each of the plurality of decoders is electrically connected to one of the lower and upper blocks of the plurality of memory cell array blocks.

6. The device of claim 5, further comprising, a decoder including a plurality of decoders for decoding the column address to select one of the plurality of column selecting signal lines, wherein each of the plurality of decoders is electrically connected to one of the lower and upper blocks of the plurality of memory cell array blocks and is disabled in response to the redundant enable signal, the corresponding bank address, the corresponding block address and the lower and upper block address.

7. The device of claim 6, further comprising, a bank address decoder for decoding the bank address to generate a bank selecting signal; and a block decoder for decoding the block address to generate a block selecting signal.

8. The device of claim 7, wherein the redundant enable signal generating circuit comprises:

a mode setting circuit for receiving a code applied from an external portion to generate the defective bank address, the defective block address, the defective lower and upper block address, and the defective column address during the mode setting operation;

at least two redundant control signal generating circuits, each redundant control signal generating circuit including a fuse programmed in response to the defective bank address, the defective block address, the defective lower and upper block address, and the defective column address and respectively generating a redundant control signal when the block address, the lower and upper block address and the column address which are applied from the external portion are identical to the defective block address, the defective lower and upper block address and the defective column address which are programmed during the operation; and a logical sum circuit for logically summing the redundant control signals generated from the at least two redundant control signal generating circuits to generate the redundant enable control signal.

* * * * *